(12) United States Patent
Haji et al.

(10) Patent No.: US 7,243,420 B2
(45) Date of Patent: Jul. 17, 2007

(54) ELECTRONIC COMPONENT MOUNTING METHOD

(75) Inventors: Hiroshi Haji, Chikushino (JP); Wataru Hidese, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 354 days.

(21) Appl. No.: 10/838,442

(22) Filed: May 4, 2004

(65) Prior Publication Data

US 2004/0205961 A1 Oct. 21, 2004

Related U.S. Application Data

(62) Division of application No. 10/316,348, filed on Dec. 11, 2002, now Pat. No. 6,874,225.

(30) Foreign Application Priority Data

| Dec. 18, 2001 | (JP) | ............................. 2001-384338 |
| Dec. 18, 2001 | (JP) | ............................. 2001-384339 |
| Dec. 18, 2001 | (JP) | ............................. 2001-384340 |

(51) Int. Cl.
*H05K 3/30* (2006.01)
(52) U.S. Cl. ............................. 29/832; 29/833; 29/739; 29/740; 29/720
(58) Field of Classification Search .................. 29/832, 29/833, 739, 740, 720
See application file for complete search history.

(56) References Cited

U.S. PATENT DOCUMENTS 5,547,537 A * 8/1996 Reynolds et al. ........... 156/351
5,743,001 A * 4/1998 Baker et al. ................... 29/740
5,778,525 A 7/1998 Hata et al.
7,137,195 B2 * 11/2006 Haji et al. ..................... 29/833

FOREIGN PATENT DOCUMENTS

JP 02143434 A 6/1990

* cited by examiner

*Primary Examiner*—Richard Chang
(74) *Attorney, Agent, or Firm*—Pearne & Gordon LLP

(57) ABSTRACT

In an electronic component mounting method, a camera transporting mechanism transports a camera to a component supplying unit to take an image of a component. Thereafter the camera is evacuated from an upper area of the component. The image taken by the camera is processed by a recognition processing unit to acquire a position of the component. A mounting head transporting mechanism positions the mounting head to the component based upon the recognition processing unit, and the component is picked up by the mounting head. Another camera transporting mechanism transports another camera over a board to take an image of the board. Thereafter, the camera is evacuated from an upper area of the board. The image taken of the board is processed by another recognition processing unit to determine a mounting position. The mounting head then positions the component on the board based upon the determined mounting position.

10 Claims, 10 Drawing Sheets

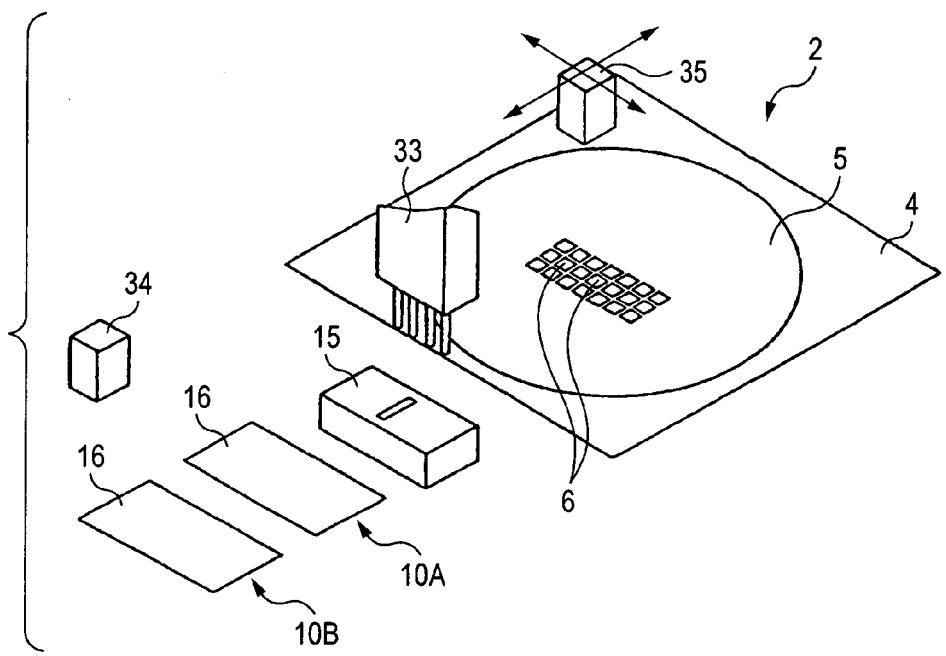
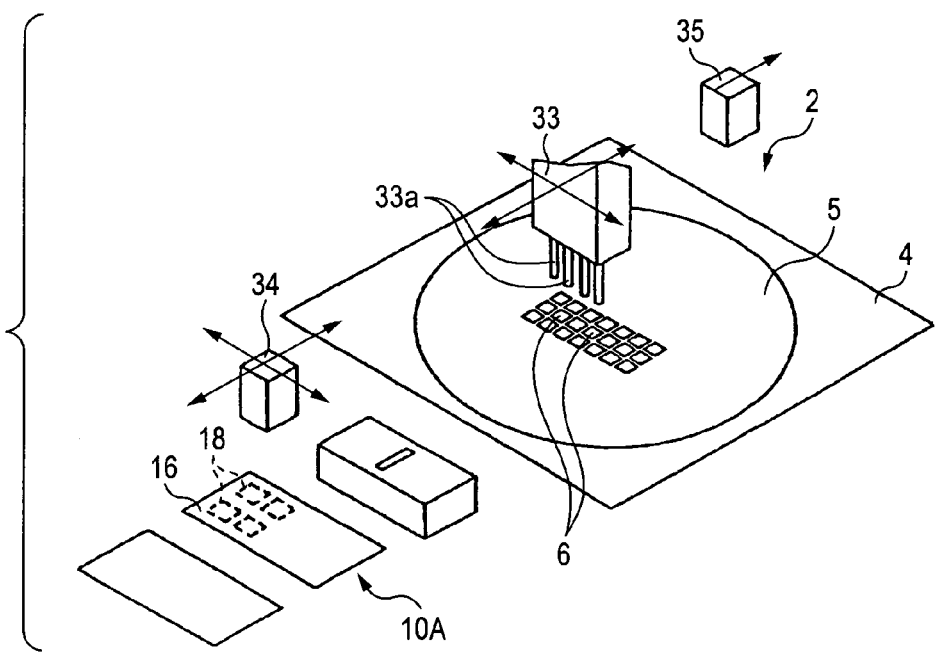

ELECTRONIC COMPONENT MOUNTING METHOD

BACKGROUND OF THE INVENTION

1. Field of the Invention

The present invention is related to an electronic component mounting apparatus and an electronic component mounting method, by which electronic components are mounted on boards.

2. Description of the Related Art

Conventionally, among electronic components (electronic parts) employed in electronic appliances, such electronic components which are supplied under such a condition that these electronic components such as semiconductor chips have been stuck onto sticking sheets are packaged, or mounted on boards such as lead frames by mounting apparatus equipped with exclusively-used pick-up apparatus. In this pick-up apparatus, since chips (semiconductor chips) are required to be picked up in higher precision by absorbing nozzles in this pick-up apparatus, which these chips are stuck in a plane-lattice shape onto a sticking sheet held by an electronic components supplying unit, a component image taking camera is required so as to recognize positions of the chips on the sticking sheet.

Also, while a board on which a chip is packaged is mounted on a board holding unit for a positioning purpose, in order to secure a better mounting quality of this chip, such a board image taking camera is required. This board image taking camera is employed so as to recognize a position of the board on the board holding unit, to investigate a coating condition of adhesive agent for adhering the chip, and also to confirm a mounting condition after the chip has been mounted. In other words, in such an electronic component mounting apparatus, under such a condition that two areas of both the electronic component supplying unit and the board holding unit are directed to transporting areas, mounting operations are carried out in such a manner that three elements of a mounting head, a component image taking camera, and a board taking camera are relatively transported while these three elements are mutually cooperated.

However, in conventionally electronic component mounting apparatus, there are many cases that operations of mounting heads, component image taking cameras, and board image taking cameras provided in both electronic component supplying units and board holding units are constituted in a series manner within the same cycle, and thus, an occurrence of loss time cannot be avoided. In this loss time, none of works is carried out in the electronic component supplying units and/or the board holding units. As a result, tact time of electronic component mounting operation is delayed, so that there is a limitation in improvements of work efficiencies.

SUMMARY OF THE INVENTION

Therefore, the present invention has an object to provide an electronic component mounting apparatus and an electronic component mounting method, capable of shortening tack time and also capable of improving a work efficiency.

An electronic component mounting apparatus recited in claim 1 is featured by such an electronic component mounting apparatus for mounting an electronic component on an electronic component mounting position of a board, comprising: an electronic component supplying unit for supplying electronic components by arraying a plurality of the electronic components in a plane shape; a board holding unit arranged at a position separated from the electronic component supply unit along a first direction; a mounting head for picking up an electronic component of the electronic component supplying unit to hold the picked electronic component, and for mounting the held electronic component on an electronic component mounting position of a board held by the board holding unit; a mounting head transporting mechanism for transporting the mounting head between the electronic component supplying unit and the board holding unit; a first camera for taking an image of the board held by the board holding unit; a first camera transporting mechanism for transporting the first camera over at least the board holding unit; a first recognition processing unit for processing an image taken by the first camera so as to acquire an actual position of the electronic component mounting position of the board held by the board holding unit; a second camera for taking an image of the electronic component of the electronic component supplying unit; a second camera transporting mechanism for transporting the second camera over at least the electronic component supplying unit; a second recognition processing unit for processing an image of the second camera so as to acquire a position of the electronic component of the electronic component supplying unit; mounting head transporting control means for controlling the mounting head transporting mechanism so as to execute: (1) a positioning operation of the mounting head in the case that the electronic component is picked up from the electronic component supplying unit based upon the position of the electronic component acquired by the second recognition processing unit, and also in order to perform: (2) a positioning operation of the mounting head in the case that the electronic component is mounted on the board of the board holding unit based upon the actual position of the electronic component mounting position acquired by the first recognition processing unit; first camera transporting control means for controlling the first camera transporting mechanism so as to execute: (1) a positioning operation of the first camera in the case that an image of the board held by the board holding unit is taken, and also in order to perform: (2) an evacuating operation for transporting the first camera to a position where mounting of the electronic component by the mounting head is not disturbed; and second camera transporting control means for controlling the second camera transporting mechanism so as to execute: (1) a positioning operation of the second camera in the case that an image of the electronic component of the electronic component supplying unit is taken, and also in order to perform: (2) an evacuating operation for transporting the second camera to a position where the pick-up operation of the electronic component by the mounting head is not disturbed.

An electronic component mounting apparatus recited in claim 2 is featured by that the first camera takes an image of the electronic component mounting position of the board so as to acquire an image thereof, and the first recognition processing unit processes the image in order to acquire the actual position of the electronic component mounting position.

An electronic component mounting apparatus recited in claim 3 is featured by that the first camera takes images of both the electronic component mounting position and adhesive agent coated at the electronic component mounting position so as to acquire images thereof; and the first recognition processing unit processes the acquired images in order to acquire the actual position of the electronic component mounting position and also to investigate a coating condition of adhesive agent coated at the electronic component mounting position.

An electronic component mounting apparatus recited in claim 4 is featured by that the first camera takes an image of the electronic component mounting position of the board on which the electronic component is mounted to acquire an image thereof; the first recognition processing unit processes the acquired image taken by the first camera so as to investigate a mounting condition of the electronic component; and the first camera transporting control means causes the first camera transporting mechanism to execute a positioning operation of the first camera in the case that the first camera takes an image of the electronic component mounting position of the board on which the electronic component is mounted.

An electronic component mounting apparatus recited in claim 5 is featured by that the mounting head transporting mechanism is arranged by containing: one pair of first direction guides arranged in parallel to the first direction and in such a manner that the paired first direction guides sandwich both the electronic component supply unit and the board holding unit; a beam member equipped with a second direction guide, both ends of which are supported by the paired first direction guides, and which guides the mounting head along a second direction located perpendicular to the first direction; a first direction drive mechanism for transporting the beam member along the first direction guides; and a second direction drive mechanism for transporting the mounting head along the second direction guide.

An electronic component mounting apparatus recited in claim 6 is featured by that the first camera transporting mechanism is arranged by containing: one pair of first direction guides arranged in parallel to the first direction and in such a manner that the paired first direction guides sandwich both the electronic component supply unit and the board holding unit; a beam member equipped with a second direction guide, both ends of which are supported by the paired first direction guides, and which guides the first camera along a second direction located perpendicular to the first direction; a first direction drive mechanism for transporting the beam member along the first direction guides; and a second direction drive mechanism for transporting the first camera along the second direction guide.

An electronic component mounting apparatus recited in claim 7 is featured by that the second camera transporting mechanism is arranged by containing: one pair of first direction guides arranged in parallel to the first direction and in such a manner that the paired first direction guides sandwich both the electronic component supply unit and the board holding unit; a beam member equipped with a second direction guide, both ends of which are supported by the paired first direction guides, and which guides the second camera along a second direction located perpendicular to the first direction; a first direction drive mechanism for transporting the beam member along the first direction guides; and a second direction drive mechanism for transporting the second camera along the second direction guide.

An electronic component mounting apparatus recited in claim 8 is featured by that the mounting head transporting mechanism is arranged by containing: one pair of first direction guides arranged in parallel to the first direction and in such a manner that the paired first direction guides sandwich both the electronic component supply unit and the board holding unit; a center beam member equipped with a second direction guide, both ends of which are supported by the paired first direction guides, and which guides the mounting head along a second direction located perpendicular to the first direction; a first direction drive mechanism for transporting the center beam member along the first direction guides; and a second direction drive mechanism for transporting the mounting head along the second direction guide; the first camera transporting mechanism includes: a first beam member equipped with a second direction guide, both ends of which are supported by the paired first direction guides, and which guides the first camera along a second direction located perpendicular to the first direction; a first direction drive mechanism for transporting the first beam member along the first direction guides; and a second direction drive mechanism for transporting the first camera along the second direction guide; and the second camera transporting mechanism includes: a second beam member equipped with a second direction guide, both ends of which are supported by the paired first direction guides, and which guides the second camera along a second direction located perpendicular to the first direction; a first direction drive mechanism for transporting the second beam member along the first direction guides; and a second direction drive mechanism for transporting the second camera along the second direction guide.

An electronic component mounting apparatus recited in claim 9 is featured by that both a third camera for taking an image of the electronic component held by the mounting head, and a third recognition processing unit for processing the image taken by the camera so as to acquire a position of the electronic component held by the mounting head are provided between the electronic component supplying unit and the board holding unit; and the mounting head transporting control means controls the mounting head transporting mechanism so as to execute: (1) a positioning operation of the mounting head in the case that the electronic component is picked up from the electronic component supplying unit based upon the position of the electronic component acquired by the second recognition processing unit, and also in order to perform: (2) a positioning operation of the mounting head in the case that the electronic component is mounted on the board of the board holding unit based upon the actual position of the electronic component mounting position acquired by the first recognition processing unit, and also the position of the electronic component acquired by the third recognition processing unit.

An electronic component mounting apparatus recited in claim 10 is featured by that the board holding unit is comprised of a plurality of board holding mechanisms for holding boards.

An electronic component mounting apparatus recited in claim 11 is featured by that the electronic component mounting apparatus is further comprised of: a board carry-in conveyor for carrying a board in the electronic component mounting apparatus; a board bring-out conveyor for bringing out a board on which an electronic component has been mounted from the electronic component mounting apparatus; a board apportioning unit for receiving boards from the board carry-in conveyor and for apportioning the received boards one by one to the plurality of board holding mechanisms so as to transport the boards; and a board receiving/supplying unit for receiving the boards on which the electronic components have been mounted from the plurality of board holding mechanisms and for supplying the received boards to the board bring-out conveyor.

An electronic component mounting apparatus recited in claim 12 is featured by that the electronic component supplying unit is comprised of a jig holding unit for detachably holding a jig having a sticking sheet on which a plurality of electronic components have been stuck.

An electronic component mounting apparatus recited in claim 13 is featured by that a sticking sheet exfoliating mechanism for exfoliating an electronic component picked up by the mounting head from the sticking sheet is provided under the sticking sheet.

An electronic component mounting apparatus recited in claim 14 is featured by that the mounting head is equipped with a plurality of nozzles which each holds one of the electronic components, and is movable under such a condition that the plurality of electronic components are held.

An electronic component mounting method recited in claim 15 is featured by that in an electronic component mounting method executed by an electronic component mounting apparatus comprising: a mounting head for picking up an electronic component of an electronic component supplying unit to hold the picked electronic component, and for mounting the held electronic component on an electronic component mounting position of a board held by a board holding unit; a mounting head transporting mechanism for transporting the mounting head between the electronic component supplying unit and the board holding unit; a first camera for taking an image of the board held by the board holding unit; a first camera transporting mechanism for transporting the first camera over at least the board holding unit; a first recognition processing unit for processing an image taken by the first camera so as to acquire an actual position of the electronic component mounting position of the board held by the board holding unit; a second camera for taking the electronic component of the electronic component supplying unit; a second camera transporting mechanism for transporting the second camera over at least the electronic component supplying unit; a second recognition processing unit for processing an image of the second camera so as to acquire a position of the electronic component of the electronic component supplying unit; the electronic mounting method is comprised of:

a first step in which the second camera is transported to the electronic component supplying unit by the second camera transporting mechanism to take an image of an electronic component, and thereafter the second camera is evacuated from an upper area of the electronic component by the second camera transporting mechanism; a second step in which an image taken by the second camera is processed by the second recognition processing unit so as to acquire a position of the electronic component; a third step in which while the mounting head transporting mechanism executes a positioning operation for positioning the mounting head to the electronic component based upon the position of the electronic component acquired by the second recognition processing unit, the electronic component is picked up by the mounting head; a fourth step in which the first camera is transported by the first camera transporting mechanism over a board held by the board holding unit so as to take an image of the board by the first camera, and thereafter the first camera is evacuated from an upper area of the board by the first camera transporting mechanism; a fifth step in which the image taken by the first camera is processed by the first recognition processing unit so a to acquire an actual position of the electronic component mounting position of the board; and a sixth step in which while the mounting head transporting mechanism executes a positioning operation for positioning the mounting head to the electronic component mounting position based upon the actual position of the electronic component mounting position acquired by the first recognition processing unit, the electronic component held by the mounting head is mounted on the electronic component mounting position; wherein: while the electronic component held by the mounting head is mounted on the electronic component mounting position, the second camera is again transported over the electronic component supporting unit so as to take an image of an electronic component which is subsequently picked up by the second camera.

An electronic component mounting method recited in claim 16 is featured by that the first camera takes the electronic component mounting position of the board so as to acquire an image thereof in the fourth step, and the first recognition processing unit processes the image in order to acquire the actual position of said electronic component mounting position in the fifth step.

An electronic component mounting method recited in claim 17 is featured by that the first camera takes both the electronic component mounting position and adhesive agent coated at the electronic component mounting position so as to acquire images thereof in the fourth step; and the first recognition processing unit processes the acquired images in order to acquire the actual position of the electronic component mounting position and also to investigate a coating condition of adhesive agent coated at the electronic component mounting position in the fifth step.

An electronic component mounting method recited in Clam 18 is featured by that the electronic component mounting method is further comprised of: a seventh step in which the first camera transporting mechanism transports the first camera over an electronic component mounting position of the board on which the electronic component has been mounted so as to take the electronic component mounting position; and an eighth step in which the image taken in the seventh step is processed by the first recognition processing unit so as to investigate a mounting condition of the electronic component.

An electronic component mounting method recited in claim 19 is featured by that the subsequent fourth step is continuously carried out after the seventh step.

An electronic component mounting method recited in claim 20 is featured by that in an electronic component mounting method executed by an electronic component mounting apparatus comprising: a mounting head for picking up an electronic component of an electronic component supplying unit to hold the picked electronic component, and for mounting the held electronic component on an electronic component mounting position of a board held by a board holding unit; a mounting head transporting mechanism for transporting the mounting head between the electronic component supplying unit and the board holding unit; a first camera for taking an image of the board held by the board holding unit; a first camera transporting mechanism for transporting the first camera over at least the board holding unit; a first recognition processing unit for processing an image taken by the first camera so as to acquire an actual position of the electronic component mounting position of the board held by the board holding unit; a second camera for taking an image of the electronic component of the electronic component supplying unit; a second camera transporting mechanism for transporting the second camera over at least the electronic component supplying unit; a second recognition processing unit for processing an image of the second camera so as to acquire a position of the electronic component of the electronic component supplying unit;

the electronic mounting method is comprised of: a first step in which the second camera is transported to the electronic component supplying unit by the second camera transporting mechanism to take an image of a plurality of electronic components, and thereafter the second camera is evacuated from an upper area of the plural electronic components by the second camera transporting mechanism; a second step in which images taken by the second camera are processed by the second recognition processing unit so as to acquire positions of the plural electronic components; a third step in which while the mounting head transporting mechanism executes a positioning operation for sequentially positioning the mounting head to the plural electronic components based upon the positions of the plural electronic components acquired by the second recognition processing unit, the plural electronic components are sequentially picked up by the mounting head; a fourth step in which the first camera is transported by the first camera transporting mechanism over a board held by the board holding unit so as to take an image of the board by the first camera, and thereafter the first camera is evacuated from an upper area of the board by the first camera transporting mechanism; a fifth step in which the image taken by the first camera is processed by the first recognition processing unit so a to acquire actual positions of the plural electronic component mounting positions of the board; and a sixth step in which while the mounting head transporting mechanism executes a positioning operation for sequentially positioning the mounting head to the plural electronic component mounting positions based upon the positions of the plural electronic component mounting positions acquired by the first recognition processing unit, the plural electronic components held by the mounting head are sequentially mounted on the plural electronic component mounting positions; wherein: while the electronic components held by the mounting head are sequentially mounted on the plural electronic component mounting positions, the second camera is again transported over the electronic component supporting unit so as to take an image of a plurality of electronic components which are subsequently picked up by the second camera.

An electronic component mounting method recited in claim 21 is featured by that the first camera takes images of a plurality of electronic component mounting positions of the board so as to acquire images thereof in the fourth step, and the first recognition processing unit processes the images in order to acquire the actual positions of the plural electronic component mounting positions in the fifth step.

An electronic component mounting method recited in claim 22 is featured by that the first camera takes images of both the plural electronic component mounting positions and adhesive agent coated at the plural electronic component mounting positions so as to acquire images thereof in the fourth step; and the first recognition processing unit processes the acquired images in order to acquire the actual positions of the plural electronic component mounting positions and also to investigate coating conditions of adhesive agent coated at the plural electronic component mounting positions in the fifth step.

An electronic component mounting method recited in claim 23 is featured by that the electronic component mounting method is further comprised of: a seventh step in which the first camera transporting mechanism transports the first camera over a plurality of electronic component mounting positions of the board on which the electronic components have been mounted so as to take images of the plural electronic component mounting positions; and an eighth step in which the images taken in the seventh step are processed by the first recognition processing unit so as to investigate mounting conditions of the plural electronic components.

An electronic component mounting method recited in claim 24 is featured by that the subsequent fourth step is continuously carried out after the seventh step.

In accordance with the present invention, while the electronic component mounting apparatus is provided with the mounting head transporting mechanism for transporting the mounting head which mounts/transports the electronic component between the electronic component supplying unit and the board holding unit; the first camera transporting mechanism for transporting the first camera which takes an image of the board in the board holding unit over at least the board holding unit; and the second camera transporting mechanism for transporting the second camera which takes an image of the electronic component of the electronic component supplying unit over at least the electronic component supplying unit, since both the electronic component supplying unit and the board holding unit are defined as the range to be transported, and the mounting head, the first camera, and the second camera are relatively traveled in conjunction to each other, the occurrence of loss time in both the electronic component supplying unit and the board holding unit can be avoided, and the tact time can be shortened to improve the work efficiency.

BRIEF DESCRIPTION OF THE DRAWINGS

FIGS. 6A and 6B are explanatory diagrams for explaining process steps of an electronic component mounting method according to an embodiment mode of the present invention;

Figure 1:
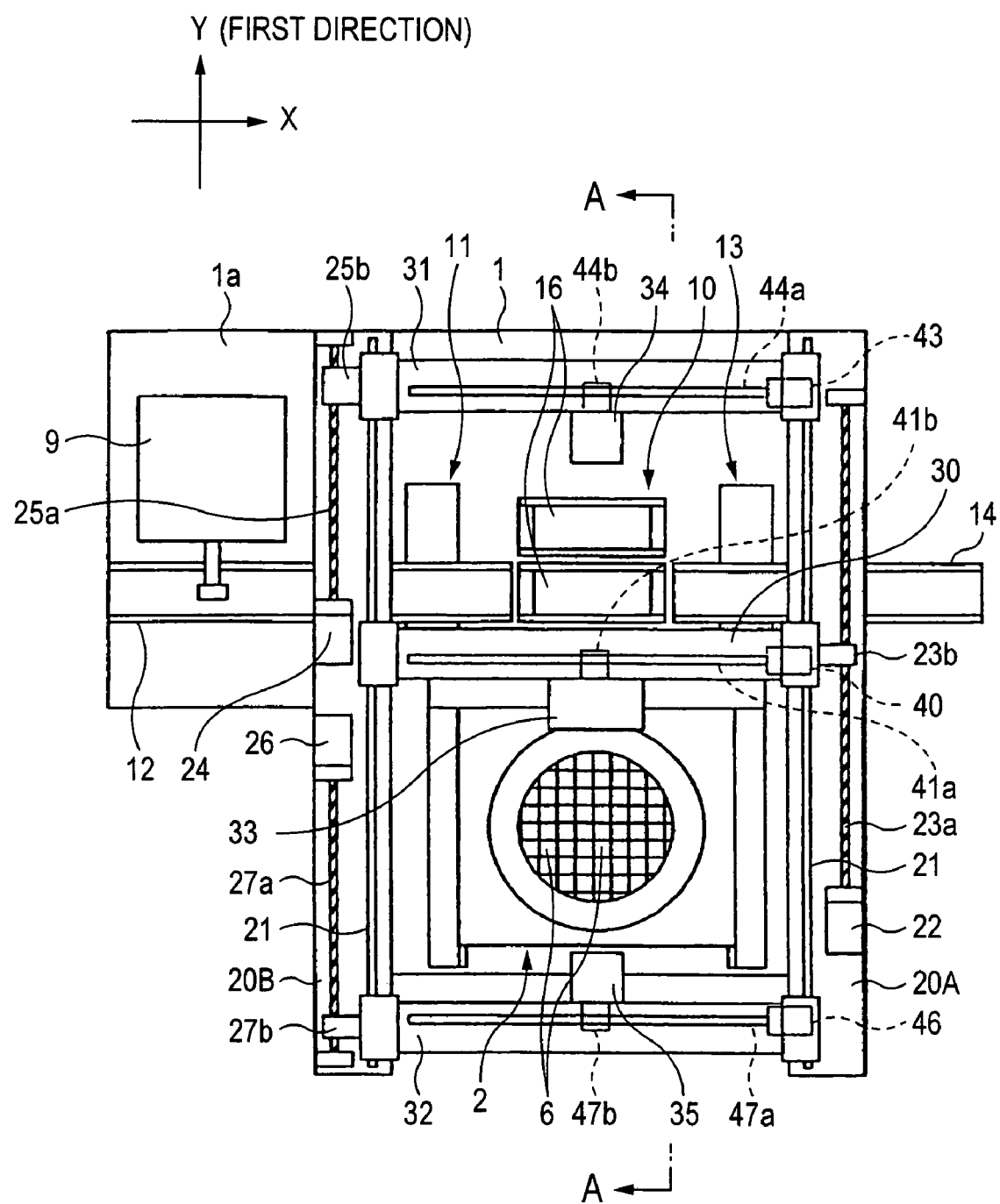
FIG. 1 is a plan view for indicating an electronic component mounting apparatus according to one embodiment mode of the present invention.

In the figures, a reference numeral 2 refers to an electronic component supplying unit; 3 to a jig holder; 4 to a jig; 5 to a stocking sheet; 6 to a chip; 7 to an ejector-XY-table; 8 to an ejector; 10 to a board holding unit; 10A to a first board holding mechanism; 10B to a second board holding mechanism; 12 to a board carry-in conveyor; 14 to a board bring-out conveyor; 15 to a third camera; 16 to a board; 16*a* to an electronic component mounting position; 17 to an adhesive agent; 30 to a center beam member; 31 to a first beam member; 32 to a second beam member; 33 to a mounting head; 34 to a first camera; 35 to a second camera; 50 to a mechanism driving unit; 53 to a data storage unit; 54 to a control unit; 55 to a first recognition processing unit; 56 to a second recognition processing unit; and 57 to a third recognition processing unit.

DETAILED DESCRIPTION OF THE PREFERRED EMBODIMENTS

Figure 2:
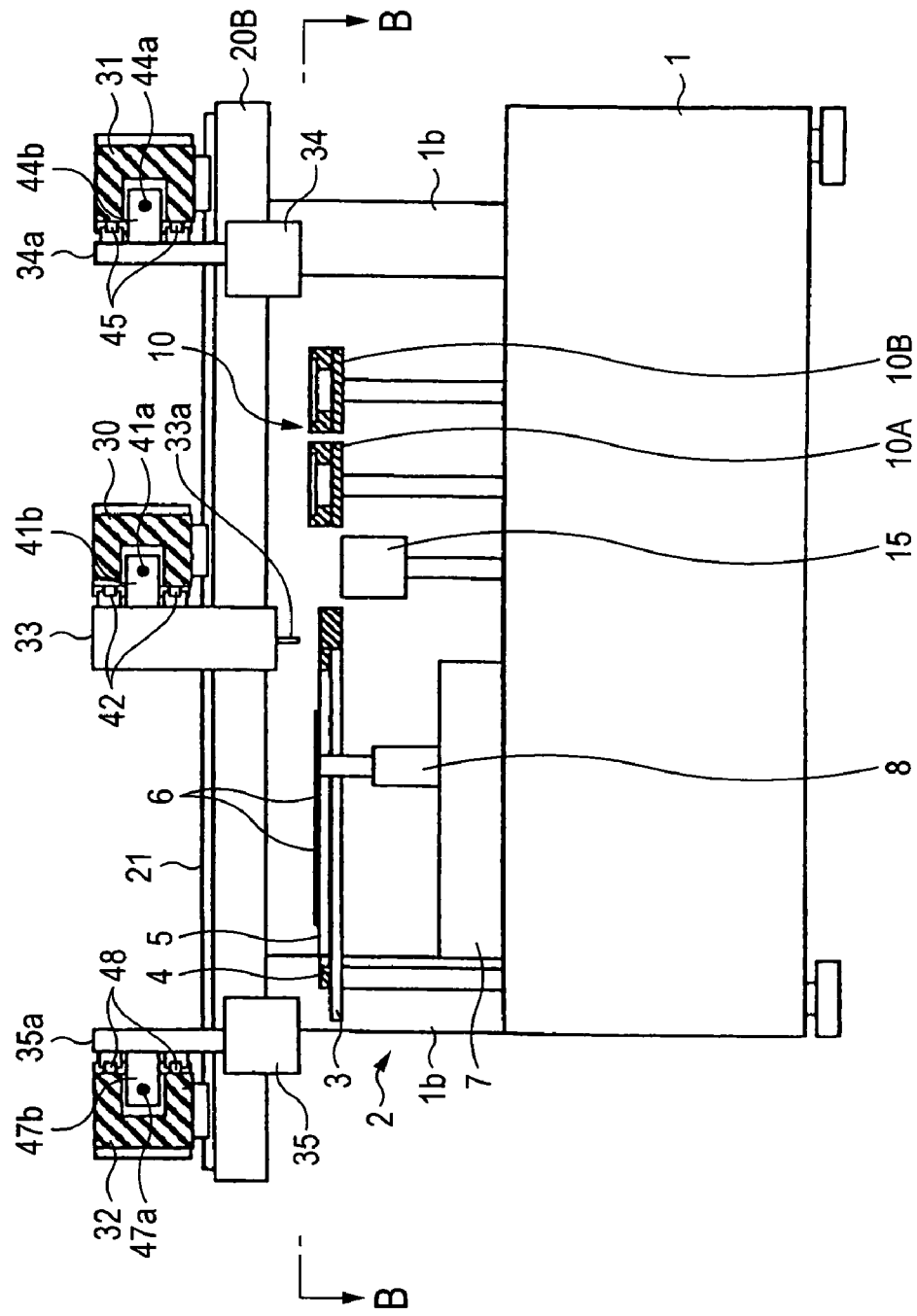
FIG. 2 is a side/sectional view for showing the electronic component mounting apparatus of one embodiment mode of the present invention.
Figure 3:
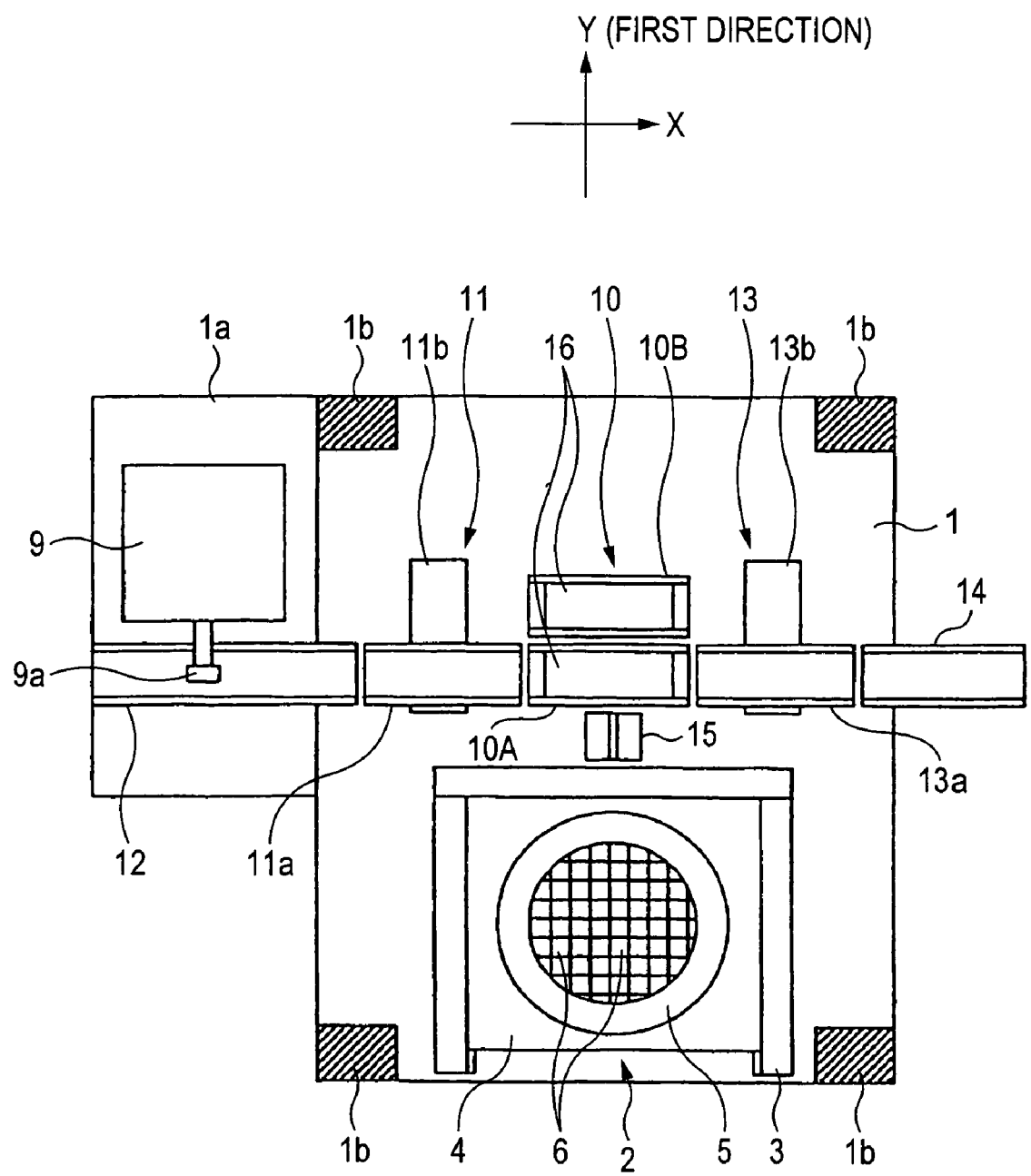
FIG. 3 is a plan/sectional view for showing the electronic component mounting apparatus of one embodiment mode of the present invention.
Figure 4:
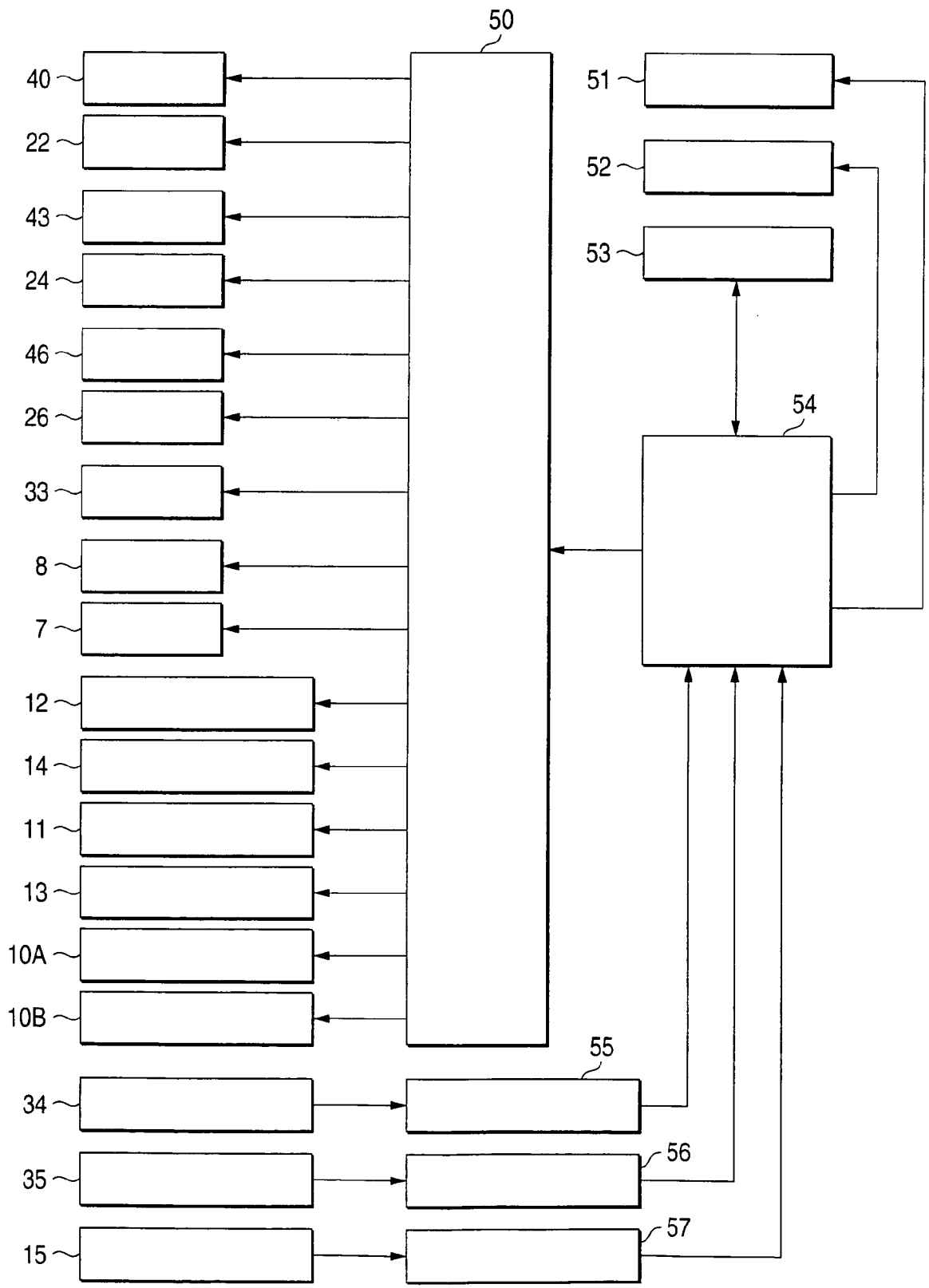
FIG. 4 is a block diagram for indicating an arrangement of a control system of the electronic component mounting apparatus according to one embodiment mode of the present invention.
Figure 5:
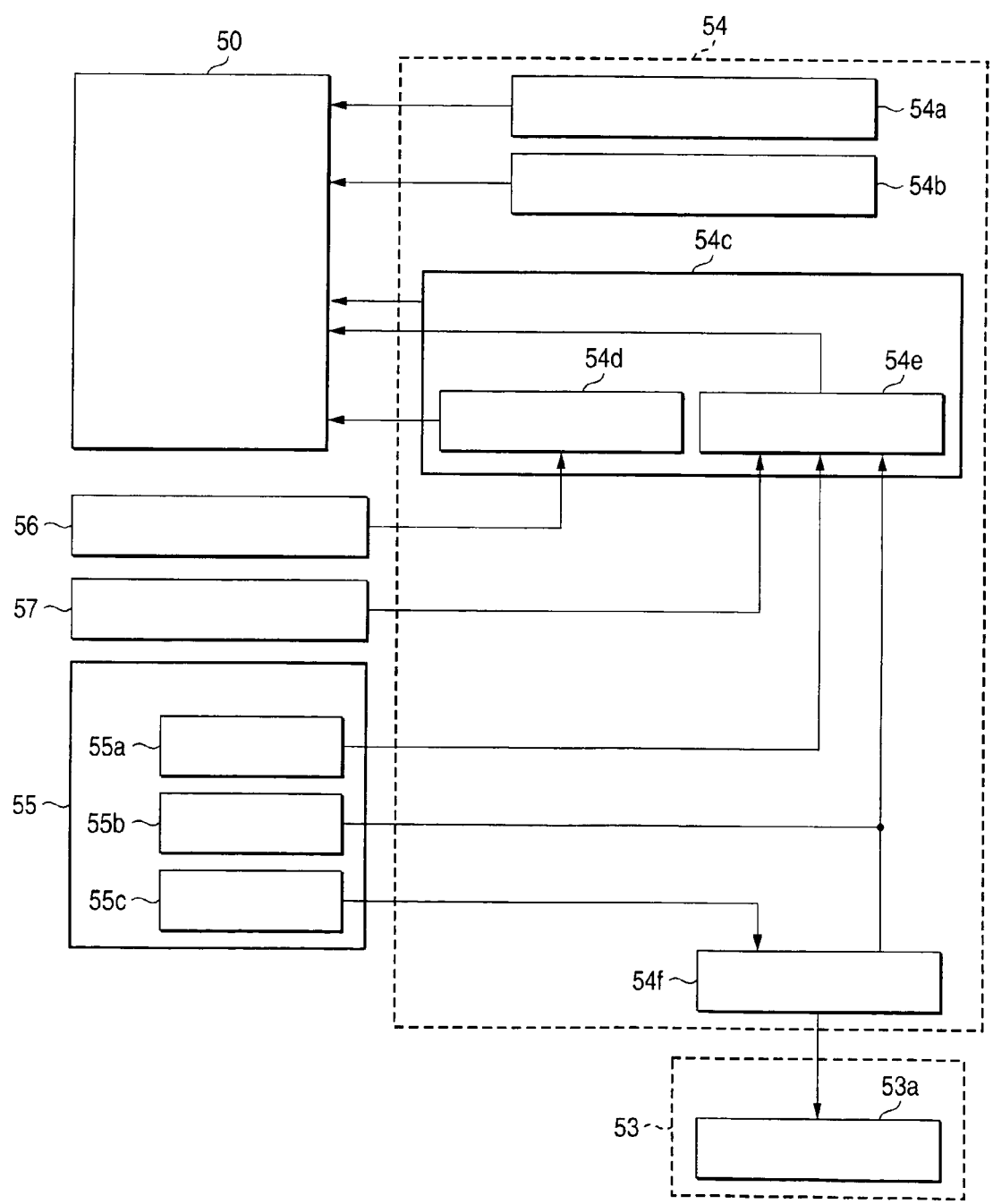
FIG. 5 is a functional block diagram for showing a processing function of the electronic component mounting apparatus according to one embodiment mode of the present invention.

Referring now to drawings, embodiment modes of the present invention will be described. FIG. 1 is a plan view for showing an electronic component mounting apparatus according to one embodiment mode of the present invention, FIG. 2 is a side/sectional view for representing the electronic component mounting apparatus according to one embodiment mode of the present invention, and FIG. 3 is a plan/sectional diagram for indicating the electronic component mounting apparatus according to one embodiment mode of the present invention. FIG. 4 is a block diagram for indicating an arrangement of a control system of the electronic component mounting apparatus according to one embodiment mode of the present invention, and FIG. 5 is a functional block diagram for showing process functions of the electronic component mounting apparatus according to one embodiment mode of the present invention. FIGS. 6A and 6B, FIGS. 7A and 7B, FIGS. 8A and 8B, and FIGS. 9A and 9B are explanatory diagrams for explaining process steps of an electronic component mounting method according to one embodiment mode of the present invention, and FIGS. 10A, 10B, 10C, and 10D are plan views for representing boards on which electronic components will be mounted, according to one embodiment mode of the present invention.

First, an overall construction of an electronic component mounting apparatus will now be described with reference to FIG. 1, FIG. 2, and FIG. 3. FIG. 2 is the sectional view for indicating this electronic component mounting apparatus, taken along an arrow A-A of FIG. 1, and FIG. 3 is the sectional view of representing this electronic component mounting apparatus, taken along an arrow B-B of FIG. 1. In FIG. 1, an electronic component supplying unit 2 is arranged on a base board 1. As shown in FIG. 2 and FIG. 3, the electronic component supplying unit 2 is equipped with a jig holder (jig holding unit) 3. The jig holder 3 detachably holds a jig 4 on which a sticking sheet 5 is mounted. Semiconductor chips 6 (will be simply abbreviated as "chips 6" hereinafter) corresponding to electronic components (electronic parts) are stuck on the sticking sheet 5 under such a condition that these chips 6 are individually separated from each other. Under such a condition that the jig 4 is held by the jig holder 3, the electronic component supplying unit 2 supplies the chips 6 by arranging a plurality of semiconductor chips in a plane shape.

As indicated in FIG. 2, an ejector 8 is arranged under the sticking sheet 5 held by the jig holder 3 in such a manner that this ejector 8 can be horizontally transported by an ejector-XY-table 7. The ejector 8 is equipped with a pin elevation mechanism for elevating a chip-raising ejector pin (not shown). In the case that the chips 6 are picked up from the sticking sheet 5 by a mounting head (will be explained later), the chips 6 are raised from the lower portion of the sticking sheet 5 by the ejector pin, so that the chips 6 are exfoliated from the sticking sheet 5. The ejector 8 constitutes a sticking sheet exfoliating mechanism for exfoliating the chips 6 form the sticking sheet 5.

As shown in FIG. 3, a board holding unit 10 is arranged at such a position separated from the electronic component supplying unit 2 provided on the upper plane of the base board 1 along a Y direction (namely, first direction). On the upper stream side and the lower stream side of the board holding unit 10, a board carry-in conveyor 12, a board apportioning unit 11, a board holding unit 10, a board receiving/supplying unit 13, and a board bring-out conveyor 14 are arranged in a series manner along an X direction. The board carry-in conveyor 12 is arranged in such a manner that the board carry-in conveyor 12 rides on a sub-board base 1a coupled to the board base 1. An adhesive agent coating apparatus 9 is arranged on the sub-board base 1a. The adhesive agent coating apparatus 9 coats adhesive agent 17 (see FIGS. 10A to 10D) for adhering the chips 6 by a coating head 9a with respect to a board 16 which has been carried in the board carry-in conveyor 12 from the upper stream side.

The board 16 on which the adhesive agent has been coated is transported to the board apportioning unit 11. The board apportioning unit 11 is constructed in such a manner that an apportioning conveyor 11a can be slid along the Y direction by a slide mechanism 11b. This board apportioning unit 11 selectively apportions the boards 16 received from the board carry-in conveyor 12 to two sets of board holding mechanisms (will be explained later) of the board holding unit 10. The board holding unit 10 is provided with a first board holding unit 10A and a second board holding unit 10B. This board holding unit 10 holds the board 16 apportioned by the board apportioning unit 11 so as to position this held board 16 at a mounting position.

The board receiving/supplying unit 13 is arranged in such a manner that a receiving/supplying conveyor 13a can be slid by a slide mechanism 13b along the Y direction similar to the board apportioning unit 11. The receiving/supplying conveyor 13c is selectively connected to a first board holding mechanism 10A and a second board holding mechanism 10B, so that this receiving supplying conveyor 13a receives the board 16 on which the chips 6 have been packaged, and then supplies this received board 16 to the board bring-out conveyor 14. The board bring-out conveyor 14 brings out the supplied board 16 on which the chips 6 have been mounted to the down stream side.

In FIG. 1, both a first Y-axis base 20A and a second Y-axis base 20B are arranged on both edge portions of an upper plane of the base board 1 in such a manner that longitudinal directions of the first and second Y-axis bases 20A/20B are directed to the Y direction (first direction) located perpendicular to the board carrying direction (X direction). A pair of first direction guide 21 are arranged on an upper plane of the first Y-axis base 20A and an upper plane of the second X-axis base 20B in such a manner that the first direction guides 21 are located substantially over entire lengths thereof along a longitudinal direction (Y direction), and one pair of these first direction guides 21 are positioned in parallel thereto and also sandwich both the electronic component supplying unit 2 and the board holding unit 10.

Three sets of beam members (namely, a first beam member 31, a center beam member 30, and a second beam member 32) are suspended by these paired first direction guides 21 in such a manner that both edge portions of each of these three beam members 30, 31, 32 are supported by the first direction guides 21 and can be freely slid along the Y direction.

A nut member 23b is projected on a side edge portion of a right side of this center beam member 30, and a feed screw 23a meshed with the nut member 23b is rotated by a Y-axis motor 22 which is arranged on the first Y-axis base 20A along the horizontal direction. Since the Y-axis motor 22 is driven, the center beam member 30 is horizontally transported along the Y-direction along the first direction guides 21.

Also, nut members 25b and 27b are projected on side edge portions of left sides of the first beam member 31 and the second beam member 32. Feed screws 25a and 27a which are meshed to these nut members 25b and 27b are rotated by Y-axis motors 24 and 26, which are arranged on the second Y-axis base 20B respectively along the horizontal direction. Since the Y-axis motors 24 and 26 are driven, both the first beam member 31 and the second beam member 32 are horizontally transported in the Y direction along the first direction guides 21.

A mounting head 33 is mounted on the center beam member 30, and a feed screw 41a which is meshed with a nut member 41b coupled to this mounting head 33 is rotated by an X-axis motor 40. Since the X-axis motor 40 is driven, the mounting head 33 is guided by a second direction guide (see FIG. 2) so as to be transported along the X direction. This second direction guide 42 is provided on a side plane of the center beam member 30.

The mounting head 33 is provided with plural sets (four sets in this case) of nozzles 33a for holding one piece of chip 6. The mounting head 33 may be transported under such a condition that each of the chips 6 is absorbed by each of the nozzles 33a, and a plurality of chips 6 are held. Since both the Y-axis motor 22 and the X-axis motor are driven, the mounting head 33 is horizontally transported along the X direction and the Y direction, picks up the chips 6 of the electronic component supplying unit 2, and then, mounts the held chips 6 on an electronic component mounting position 16a of the board 16 held by the electronic component supplying unit 2.

One pair of the first direction guides 21, the center beam member 30, a first direction drive mechanism (namely, Y-axis motor 22, feed screw 23a, and nut member 23b), and also a second director drive mechanism (namely, X-axis motor 40, feed screw 41a, and nut member 41b) constitute a mounting head transporting mechanism for transporting the mounting head 33 between the electronic component supplying unit 2 and the board holding unit 10. The first direction drive mechanism transports the center beam member 30 along the first direction guides 21, whereas the second direction drive mechanism transports the mounting head 33 along the second direction guide 42.

A first camera 34 is mounted on the first beam member 31, and a nut member 44b is coupled to a bracket 34a for holding this first camera 34. A feed screw 44a meshed with the nut member 44b is rotated by an X-axis motor 43. Since the X-axis motor 43 is driven, the first camera 34 is guided by a second direction guide 45 (see FIG. 2) provided on a side plane of the first beam member 31 so as to be transported along the X-direction.

Since both the Y-axis motor 24 and the X-axis motor 43 are driven, the first camera 34 is horizontally transported along the X direction and the Y direction. As a result, the first camera 34 can be transported over the board holding unit 10 and also can be transported so as to be evacuated from the board holding unit 10 in order that this first camera 34 images, or takes an image of the board 16 which is held by the first board holding mechanism 10A and the second board holding mechanism 10B of the board holding unit 10.

One pair of the first direction guides 21, a first beam member 31, a first direction drive mechanism (namely, Y-axis motor 24, feed screw 25a, and nut member 25b), and also a second direction drive mechanism (namely, X-axis motor 43, feed screw 44a, and nut member 44b) constitute a first camera transporting mechanism for transporting at least the first camera 34 over the board holding unit 10. The first direction drive mechanism transports the first beam member 31 along the first direction guides 21, whereas the second direction drive mechanism transports the first camera 34 along the second direction guide 45.

A second camera 35 is mounted on the second beam member 32, and a nut member 47b is coupled to a bracket 35a for holding this second camera 35. A feed screw 47a meshed with the nut member 47b is rotated by an X-axis motor 46. Since the X-axis motor 46 is driven, the second camera 35 is guided by a second direction guide 48 (see FIG. 2) provided on a side plane of the second beam member 32 so as to be transported along the X-direction.

Since both the Y-axis motor 26 and the X-axis motor 46 are driven, the second camera 35 is horizontally transported along the X direction and the Y direction. As a result, the second camera 35 can be transported over the electronic component supplying unit 2 and also can be transported so as to be evacuated from the electronic component supplying unit 2 in order that this second camera 35 takes images of the chips 6 held by the electronic component supplying unit 2.

One pair of the first direction guides 21, a second beam member 32, a first direction drive mechanism (namely, Y-axis motor 26, feed screw 27a, and nut member 27b), and also a second direction drive mechanism (namely, X-axis motor 46, feed screw 47a, and nut member 47b) constitute a second camera transporting mechanism for transporting at least the second camera 35 over the electronic component supplying unit 2. The first direction drive mechanism transports the second beam member 32 along the first direction guides 21, whereas the second direction drive mechanism transports the second camera 35 along the second direction guide 48.

As indicated in FIG. 3, a third camera 15 is arranged between the electronic component supplying unit 2 and the board holding unit 10. Since the mounting head 33 which has picked up the chip 6 is transported over the third camera 15 in the electronic component supplying unit 2, the third camera 15 takes images of the chips 6 held on the mounting head 33.

Referring now to FIG. 4, an arrangement of a control system of an electronic component mounting apparatus will be explained. In FIG. 4, a mechanism driving unit 50 is arranged by a motor driver for electronically driving motors of the below-mentioned respective mechanisms, and a control appliance for controlling air pressure supplied to air cylinders of the respective mechanisms. Since this mechanism driving unit 50 is controlled by a control unit 54, the below-mentioned respective drive elements.

Both the X-axis motor 40 and the Y-axis motor 22 drive a mounting head transport mechanism for transporting the mounting head 33. Both the X-axis motor 43 and the Y-axis motor 24 drive the first camera transporting mechanism for transporting the first camera 34, and both the X-axis motor 46 and the Y-axis motor 26 drive the second camera transporting mechanism for transporting the second camera 35.

Also, the mechanism driving unit 50 drives an elevating mechanism of the mounting head 33, and a component absorbing mechanism constructed of nozzles 33a (see FIG. 2), drives an elevating cylinder of the ejector 8, and also a drive motor of the ejector-XY table 7. Furthermore, the mechanism driving unit 50 drives the board carry-in conveyor 12, the board bring-out conveyor 14, the board apportioning unit 11, the board receiving/supplying unit 13, the first board holding mechanism 10A, and the second board holding mechanism 10B.

A first recognition processing unit 55 processes an image taken by the first camera 34 to acquire a position of an electronic component mounting position 16a (see FIGS. 10A to 10D) of the board 16 held by the board holding unit 10. The electronic component mounting position 16a indicates a mounting position of a chip 6 on the board 16, from which the position can be detected by the image recognition. Also, the first recognition processing unit 55 processes the image taken by the first camera 34 so as to check a coating condition of an adhesive agent 17 coated at the electronic component mounting position 16a, and further so as to check a mounting condition of the chip 6 mounted on the adhesive agent 17.

A second recognition processing unit 56 processes an image taken by the second camera 35 in order to acquire a position of a chip 6 of the electronic component supplying unit 2. A third recognition processing unit 57 processes an image taken by the third camera 15 so as to acquire a position of a chip 6 mounted on the mounting head 33.

The recognition results obtained from the first recognition processing unit 55, the second recognition processing unit 56, and the third recognition processing unit 57 are supplied to the control unit 54. A data storage unit 53 stores thereinto various sorts of data such as investigation results, namely, coating condition investigation of the adhesive agent 17 and mounting condition investigation of the chips 6 (will be explained later). An operation unit 51 corresponds to an input apparatus such as a keyboard and a mouse, and enters data and a control command. A display unit 52 displays thereon imaging screens produced by the first camera 34, the second camera 35, and the third camera 15, and also displays thereon a guide screen when an input operation is performed by the operation unit 51.

Next, a description will now be made of processing functions of the electronic component mounting apparatus with reference to FIG. 5. In FIG. 5, a broken line frame 54 indicates a processing function executed by the control unit 54 shown in FIG. 4. In this case, processing functions executed by a first camera transporting process unit 54a, a second camera transporting process unit 54b, and a mounting head transporting process unit 54c constitute a first camera transporting control means, a second camera transporting control means, and a mounting head transporting control means, respectively.

The first camera transporting process unit 54a controls the first camera transporting mechanism so as to execute a positioning operation of the first camera 34 when an image of the board 16 held by the board holding unit 10 is taken by this first camera 34, and also execute such an evacuating operation that the first camera 34 is moved to a position which does not disturb mounting operation of the chips 6 by the mounting head 33. In this case, three different sorts of the board 16 are carried out, namely an image of the electronic component mounting position 16a before the chips 6 are mounted is taken; an image of the adhesive agent 17 contained in the electronic component mounting position 16a before the chips 6 are mounted is taken; and also, an image of the electronic component mounting position 16a after the chips have been mounted is taken.

The second camera transporting process unit 54b controls the second camera transporting mechanism so as to execute a positioning operation of the second camera 35 when an image of the chip 6 of the electronic component supplying unit is taken by this second camera 35, and also to execute such an evacuating operation that the second camera 35 is moved to a position which does not disturb picking-up operation of an electronic component by the mounting head 33.

The mounting head transporting process unit 54c is provided with two processing functions of a pick-up operation processing unit 54d and a mount operation processing unit 54e. The pick-up operation processing unit 54d controls the mounting head transporting mechanism so as to execute a positioning operation of the mounting head 33 in the case that the chips 6 are picked up from the electronic component supplying unit 2 based upon positions of the chips 6 acquired by the second recognition processing unit 56. The mount operation processing unit 54e controls the mounting head transporting mechanism so as to execute a positioning operation of the mounting head 33 in the case that the chips 6 are mounted on the board 16 of the board holding unit 10 based upon positions of the chips 6 acquired by the third recognition processing unit 57, and a position of the electronic component mounting position 16a acquired by an electronic component mounting position detecting process unit 55a of the first recognition processing unit 55.

The first recognition processing unit 55 contains a coating condition investigation processing unit 55b and a mounting condition investigation processing unit 55c other than the above-described electronic component mounting position detection processing unit 55a. While the mount operation processing unit 54e executes the mounting operation, the mounting operation of a chip 6 is carried out only as to such an electronic component mounting position whose coating condition is judged as "good" by referring to a result of adhesive agent coating investigation of the chip 6, which is detected by the coating condition investigation processing unit 55b.

As a result of the above-described adhesive agent coating condition investigation obtained by the coating condition investigation processing unit 55b, an investigation result recording process unit 54f executes a process operation used to store the mounting condition investigation results of the chips 6 obtained by the mounting condition investigation processing unit 55c. The data of these investigation results are supplied to the investigation result recording process unit 54f so as to be processed, and then, the processed data are stored into the investigation result storage unit 53a provided in the data storage unit 53.

While this electronic component mounting apparatus is arranged in accordance with the above-described manner, an electronic component mounting method will now be explained with reference to FIG. 6A to FIG. 10D. In FIGS. 6A and 6B, a large number of chips 6 have been stuck onto the sticking sheet 5 of the jig 4 held by the electronic component supplying unit 2. Also, the boards 16 are positioned on the first board holding mechanism 10A and the second board holding mechanism 10B, respectively, in the board holding unit 10. In this electronic component mounting method shown in this drawing, a plurality (four pieces in this case) of chips 6 are sequentially absorbed and held by four sets of the absorbing nozzles 33a provided on the mounting head 33, and then, these four chips 6 are sequentially mounted on a plurality of electronic component mounting positions 16a within one mounting turn.

First, as shown in FIG. 6A, the second camera 35 is transported over the electronic component supplying 2 by the second camera transporting mechanism, and then, images of a plurality (four pieces) of chips 6 which will be picked up are taken by the second camera 35. Thereafter, as shown in FIG. 6B, the second camera 35 is evacuated from the upper areas of these six chips 6. Then, images taken by the second camera 35 are processed by the second recognition processing unit 56 so as to acquire positions of the plural chips 6.

Next, the mounting head 33 is moved over the electronic component supplying unit 2. Then, while such a positioning operation is carried out by the mounting head transporting mechanism, a plurality of chips 6 are sequentially picked up by the four absorbing nozzles 33a of the mounting head 33. In this positioning operation, the mounting head 33 is sequentially positioned onto these chips 6 based upon the acquired positional data of these plural chips 6.

Figure 10A:
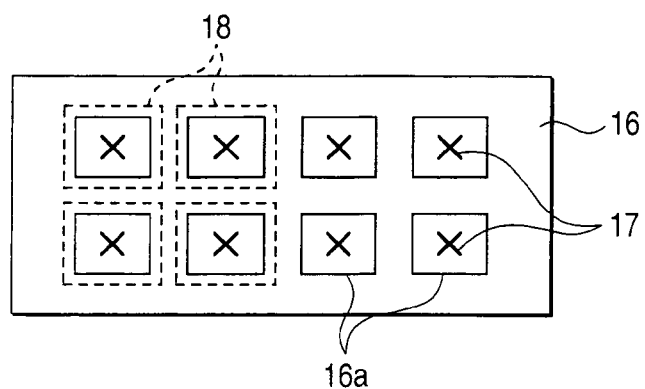
FIGS. 10A, 10B, 10C, and 10D are plan views for indicating a board to which an electronic component is mounted, according to an embodiment mode of the present invention.
Figure 10B:
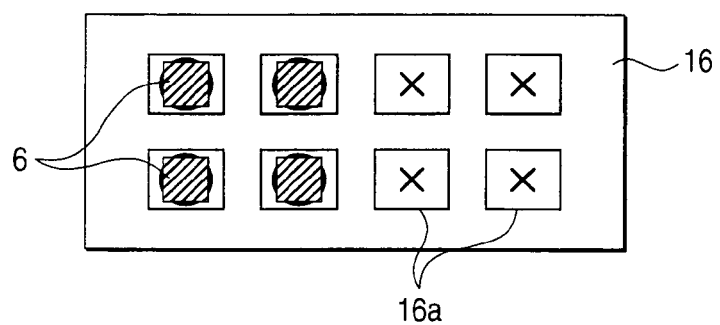

In conjunction with this pick-up operation, the first camera 34 is transported over the board 16 held by the first board holding mechanism 10A of the board holding unit 10 by the first camera transporting mechanism. Then, as shown in FIG. 10A, the first camera 34 is sequentially transported in such a manner that an image acquisition range 18 sequentially surrounds four sets of left-sided electronic component mounting positions 16a among eight sets of electronic component mounting positions 16a which are set to the board 16, and then, this first camera 34 takes images of a plurality of these electronic component mounting positions 16a and the adhesive agent 17 coated inside these electronic component mounting positions 16a. Thereafter, the first camera 34 is evacuated from the upper area of this board 16.

Then, the images of the image acquisition range 18 taken by the first camera 34 are processed by the first recognition processing unit 55 so as to acquire actual positions of the electronic component mounting positions 16a (see FIG. 10A) of the board 16. While this board 16 is recognized, an image of the adhesive agent 17 coated inside a plurality of electronic component mounting positions 16a before the chips 6 have been mounted is taken by the first camera 34 in connection with the position detections of the electronic component mounting positions 16a, so as to investigate coating conditions of the adhesive agent 17 coated on the respective electronic component mounting positions 16a. In other words, a judgment is made as to whether or not such an adhesive agent 17 having a proper coating amount has been coated at a correct coating position.

Figure 7A:
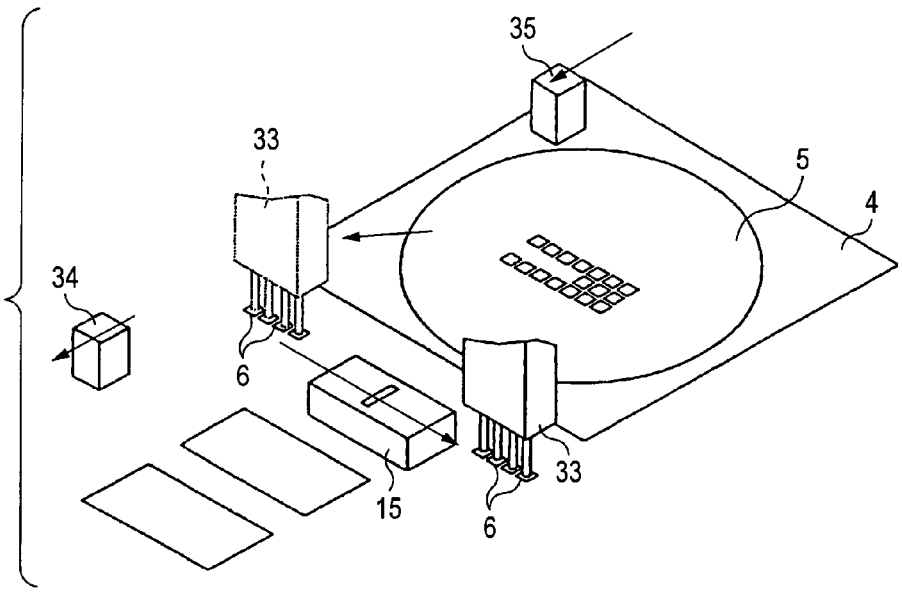
FIGS. 7A and 7B are explanatory diagrams for explaining process steps of the electronic component mounting method according to the embodiment mode of the present invention.

Next, as shown in FIG. 7A, the mounting head 33 in which the four chips 6 are held by the respective absorbing nozzles 33a is transported over the third camera 15, namely performs a scanning operation. As a result, images of the chips 6 held by the respective absorbing nozzles 33a are acquired by the third camera 15. Since this acquired image is recognition-processed by the third recognition processing unit 57, actual positions of these chips 6 may be detected.

Figure 7B:
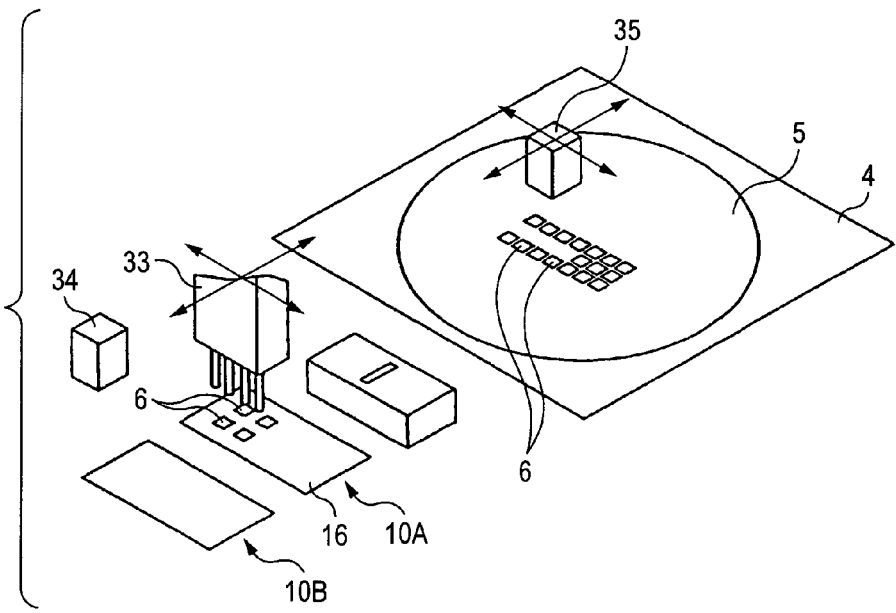

Subsequently, this scanning operation is advanced to a mounting operation. At this time, mounting operations of the chip 6 are carried out as to only such electronic component mounting positions 16a which have been judged as the good coating conditions by the first recognition processing unit 55. As represented in FIG. 7B, the mounting head 33 is transported over the board holding unit 10 as shown in FIG. 7B. Then, in this case, the mounting operation is carried out based upon the positions of the electronic component mounting positions 16a acquired by the first recognition processing unit 55, the positions of the chips 6 acquired by the third recognition processing unit 57, and the judgment result by investigating the coating conditions.

In other words, while the mounting head transporting mechanism executes such a positioning operation, the chips 6 held by the mounting head 33 are mounted one by one on the adhesive agent 17 coated inside such electronic component mounting positions 16a whose coating conditions have been judged as "good." In this positioning operation, the chips 6 held by the absorbing nozzles 33a of the mounting head 33 are sequentially positioned onto such electronic component mounting positions 16a whose coating conditions have been judged as "good" among a plurality of electronic component mounting positions 16a of the board 16 positioned on the first board holding mechanism 10A.

Figure 8A:
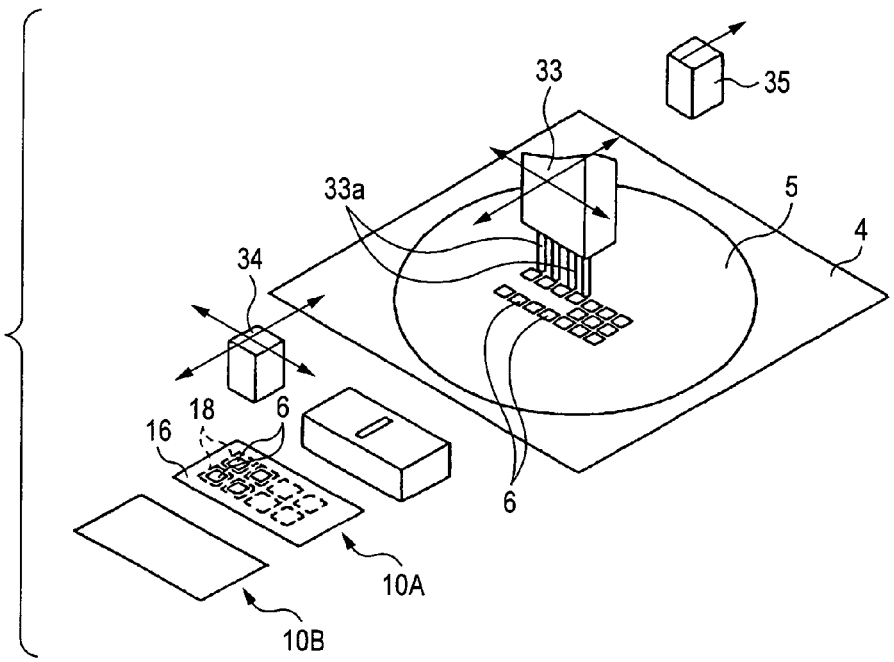
FIGS. 8A and 8B are explanatory diagrams for explaining process steps of the electronic component mounting method according to the embodiment mode of the present invention.

Then, when the mounting head 33 mounts the chips, the second camera 35 is transported over a plurality of chips 6 which are subsequently picked up in the electronic component supplying unit 2, and then, the plural chips 6 are taken by the second camera 35. Then, as indicated in FIG. 8A, the second camera 35 is evacuated from the upper area of these plural chips 6 and thereafter, the mounting head 33 is transported over the electronic component supplying unit 2. Then, while the mounting head transporting mechanism performs such a positioning operation for positioning the mounting head 33 to this chip 6 based upon the positions of the chips 6 acquired by the second recognition processing unit 56, a plurality of chips 6 are sequentially picked up by the four absorbing nozzles 33a of the mounting head 33.

Then, while the chips 6 are picked upon in the electronic component supplying unit 2, the first camera 34 is transported over the first board holding mechanism 10A of the board holding unit 10 so as to take an image of the board 16. In this case, the following investigation/detection are carried out. That is, mounting conditions of the chips 6 mounted on the board 16 are investigated; positions of a plurality of electronic component mounting positions 16a are detected on which the chips 6 are mounted in a next mounting turn; and coating conditions of adhesive agent 17 coated on these electronic component mounting positions 16a are investigated.

Figure 10C:
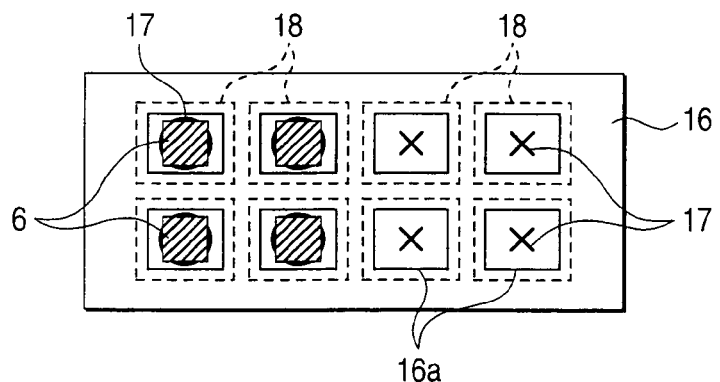

In other words, as shown in FIG. 10C, in this image taking operation, the first camera 34 is sequentially transported so as to acquire images in such a manner that eight sets of electronic component mounting positions 16a set to the board 16 are sequentially surrounded by the image acquisition range 18. Thereafter, this first camera 34 is evacuated from the upper area of this board 16. Then, the images taken by the first camera 34 are processed by the first recognition processing unit 55, and a next investigation process operation is carried out.

First, as to images of four sets of left-sided image acquisition ranges 18, mounting conditions of the chips 6 are investigated. That is to say, a check is made as to whether or not positions/attitudes of the chips 6, and sticking-out conditions of the adhesive agent 17 are normal conditions. Then, as to four sets of right-sided image acquisition ranges 18, positions of the electronic component mounting positions 16a of the board 16 are detected, and also, coating conditions of the adhesive agent 17 coated inside the electronic component mounting positions 16a before the chips 6 are mounted are investigated.

Figure 8B:
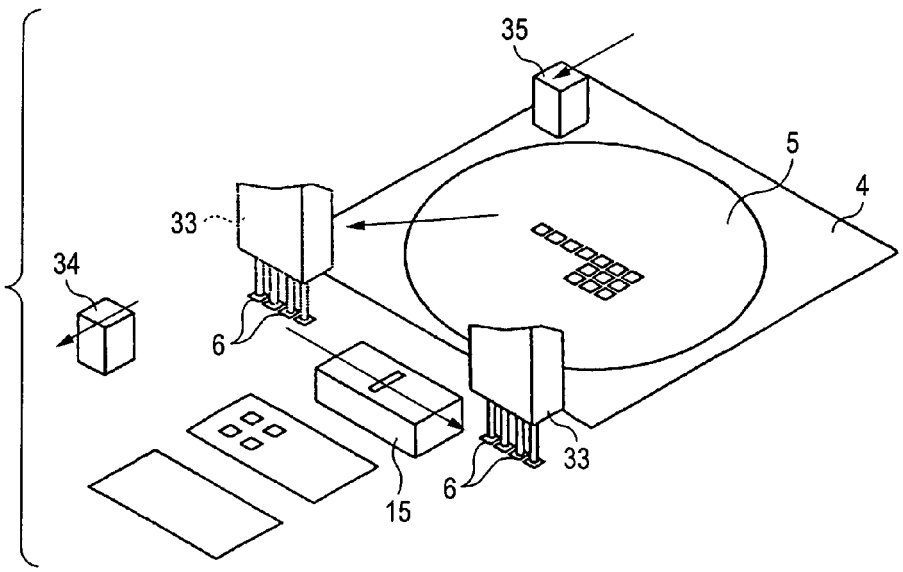

Next, as indicated in FIG. 8B, the mounting head 33 in which the four chips 6 have been held by the respective absorbing nozzles 33a is moved over the third camera 15, namely performs a scanning operation. As a result, images of the chips 6 held by the respective absorbing nozzles 33a are acquired by the third camera 15, and then, these acquired images are processed by the third recognition processing unit 57, so that actual positions of these four chips may be detected.

Figure 9A:
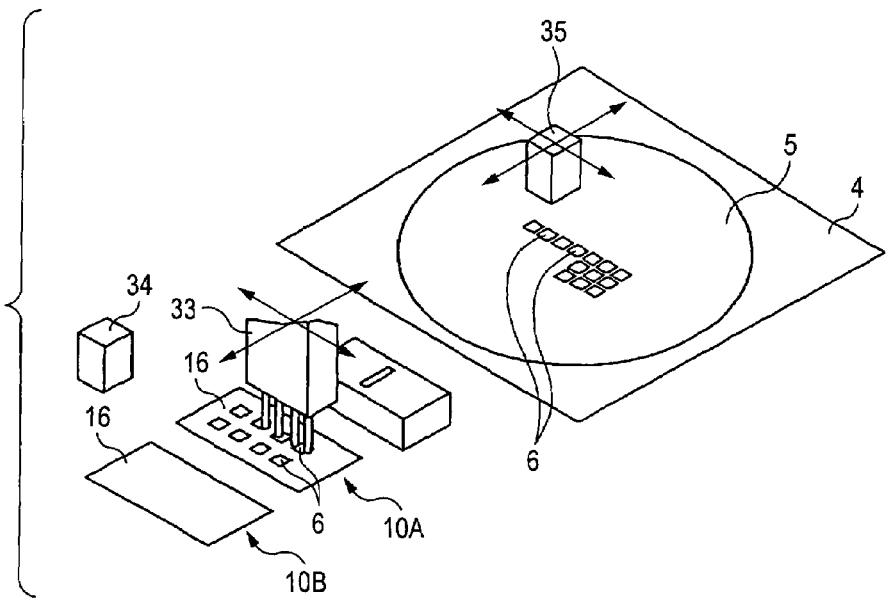
FIGS. 9A and 9B are explanatory diagrams for explaining process steps of the electronic component mounting method according to the embodiment mode of the present invention.
Figure 10D:
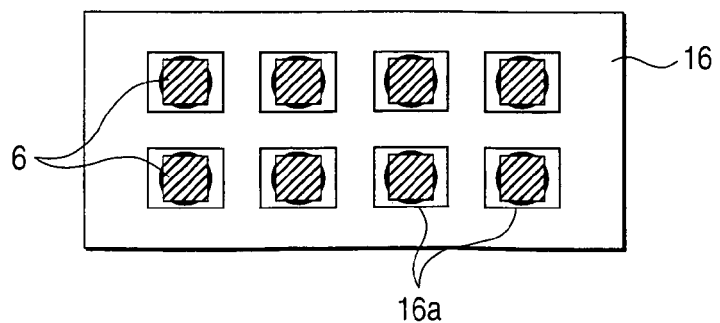

Thereafter, as indicated in FIG. 9A, the mounting head 33 is transported over the first board holding mechanism 10A of the board holding unit 10. Next, similar to FIG. 7B, the chips 6 held by the mounting head 33 are mounted on four sets of electronic component mounting positions 16a of the board 16, which are set under non-mounting conditions. As a result, as shown in FIG. 10D, the mounting operations of the chips 6 onto eight pieces of the electronic component mounting positions 16a of the board 16 are accomplished. Then, while the chips 6 are mounted by this mounting head 33, the second camera 35 is again transported over the chips 6 of the electronic component supplying unit 2, and such chips 6 which will be picked up in next time are taken by the second camera 35.

Figure 9B:
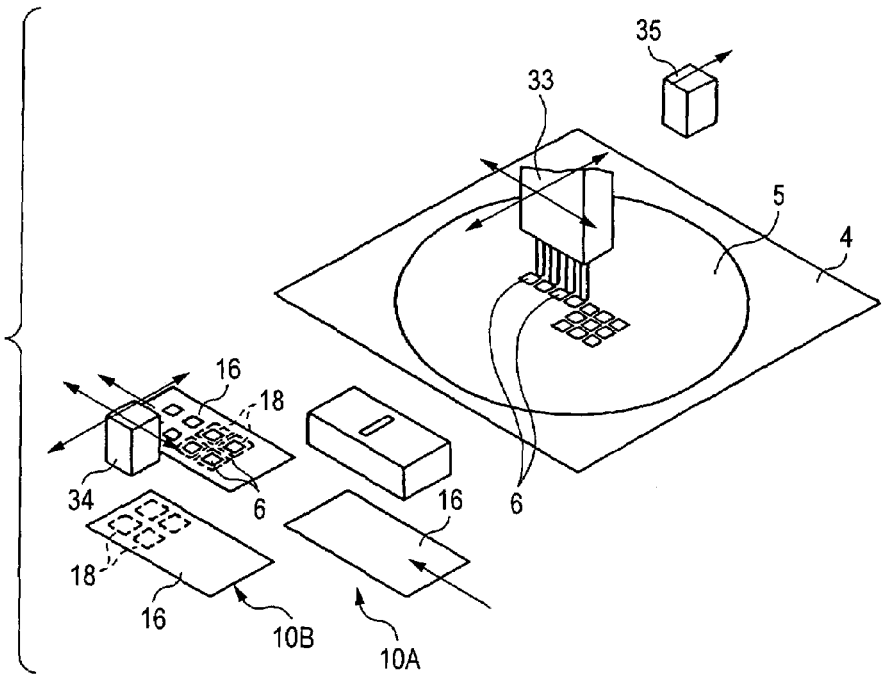

Then, as shown in FIG. 9B, when the second camera 35 is evacuated from the upper portion of this chip 6, the mounting head 33 is transported over the electronic component supplying unit 2, and the chips 6 are sequentially picked up by the four absorbing nozzles 33c of the mounting head 33 based upon the positions of the chips 6 acquired by the second recognition processing unit 56.

In conjunction with this operation, the first camera 34 is transported over the board 16 held by the first board holding mechanism 10A of the board holding unit 10. Then, the first camera 34 is sequentially transported in such a manner that the image acquisition range 18 sequentially surrounds four sets of right-sided electronic component mounting positions 16a among eight sets of the electronic component mounting positions 16a which are set to the board 16, and then, this first camera 34 acquires an image of the image acquisition range 18.

Then, the image of the image acquisition range 18 taken by the first camera 34 is processed by the first recognition processing unit 55 so as to investigate mounting conditions of the chips 6 in the electronic component mounting positions 16a of the board 16. After this investigation of the mounting condition, the board 16 is brought out from the first board holding mechanism 10A to the board receiving/supplying unit 13, and a new board 16 is carried into the first board holding mechanism 10A.

Also, the first camera 34 which has completed the image taking operation at the first board holding mechanism 10A is transported over such a board 16 held by the second board holding mechanism 10B, on which the chips 6 have not yet been mounted. At this plane, the first camera 34 takes an image of such an electronic component mounting position 16a on which the chips are subsequently scheduled to be mounted, so that a position of the electronic component mounting position 16a is detected, and also a coating condition of the adhesive agent 17 is investigated.

Subsequently, similar operations to the above-described operations are repeatedly carried out. In other words, in the above-described electronic component mounting method, both the first camera 34 for taking an image of the board 16 and the mounting head 33 for mounting thereon the chips 6 alternately access the board holding unit 10, whereas both the second camera 35 for taking images of the chips 6 and the mounting head 33 for picking up the chips 6 alternately access the electronic component supplying unit 2. As a result, the occurrence of loss time in the mounting operation can be avoided during which none of works is carried out in both the board holding unit 10 and the electronic component supplying unit 2.

In the electronic component mounting apparatus according to this embodiment mode, an image of the board of the board holding unit 10 is taken by the first camera 34 so as to execute various sorts of investigation/detection process operations by the first recognition process unit 55 while utilizing such a time duration during which the mounting head 33 performs the pick-up operation. Also, images of the chips 6 of the electronic component supplying unit 2 are taken by the second camera 35 in order to detect the positions of the chips 6 by the second recognition processing unit 56 while utilizing such a time duration during which the mounting head 33 executes the mounting operation. Alternatively, an image of the board of the board holding unit 10 may be taken by the first camera 34 so as to execute various sorts of investigation/detection process operations by the first recognition process unit 55 while utilizing such a time duration during which the mounting head 33 performs the pick-up operation and the is scanning operations. Also, alternatively, images of the chips 6 of the electronic component supplying unit 2 may be taken by the second camera 35 in order to detect the positions of the chips 6 by the second recognition processing unit 56 while utilizing such a time duration during which the mounting head 33 executes the mounting operation and the scanning operation. Since such an alternative process operation is carried out, temporal spare time may be produced in the image taking operations by the first camera 34 and the second camera 35. As a consequence, the stable operations of the electronic component mounting apparatus may be maintained.

Furthermore, since a plurality of chips 6 are picked up so as to be mounted within a single mounting turn, a total transport distance of each of these beam members can be shortened, so that work efficiencies can be increased.

It should also be noted that both the coating condition investigation and the mounting condition investigation are carried out in the electronic component mounting apparatus according to this embodiment mode. Alternatively, either one or both of these coating condition/mounting condition investigation may be omitted during the electronic component mounting operation.

In accordance with the present invention, while the electronic component mounting apparatus is provided with the mounting head transporting mechanism for transporting the mounting head which mounts/transports the electronic component between the electronic component supplying unit and the board holding unit; the first camera transporting mechanism for transporting the first camera which takes an image of the board in the board holding unit over at least the board holding unit; and the second camera transporting mechanism for transporting the second camera which takes an image of the electronic component of the electronic component supplying unit over at least the electronic component supplying unit, since both the electronic component supplying unit and the board holding unit are defined as the range to be transported, and the mounting head, the first camera, and the second camera are relatively traveled in conjunction to each other, the occurrence of loss time in both the electronic component supplying unit and the board holding unit can be avoided, and the tact time can be shortened to improve the work efficiency.

What is claimed is:

1. An electronic component mounting method executed by an electronic component mounting apparatus comprising: a mounting head for picking up an electronic component of an electronic component supplying unit to hold the picked electronic component, and for mounting said held electronic component on an electronic component mounting position of a board held by a board holding unit; a mounting head transporting mechanism for transporting said mounting head between said electronic component supplying unit and said board holding unit; a first camera for taking an image of the board held by said board holding unit; a first camera transporting mechanism for transporting said first camera over at least said board holding unit; a first recognition processing unit for processing an image taken by said first camera so as to acquire an actual position of said electronic component mounting position of the board held by said board holding unit; a second camera for taking an image of the electronic component of said electronic component supplying unit; a second camera transporting mechanism for transporting said second camera over at least said electronic component supplying unit; a second recognition processing unit for processing an image of said second camera so as to acquire a position of the electronic component of said electronic component supplying unit;

said electronic mounting method comprising:
a first step in which said second camera is transported to said electronic component supplying unit by said second camera transporting mechanism to take an image of an electronic component, and thereafter said second camera is evacuated from an upper area of said electronic component by said second camera transporting mechanism;
a second step in which an image taken by said second camera is processed by said second recognition processing unit so as to acquire a position of said electronic component;
a third step in which while said mounting head transporting mechanism executes a positioning operation for positioning said mounting head to said electronic component based upon the position of the electronic component acquired by said second recognition processing unit, said electronic component is picked up by said mounting head;
a fourth step in which said first camera is transported by said first camera transporting mechanism over a board held by said board holding unit so as to take an image of said board by said first camera, and thereafter said first camera is evacuated from an upper area of said board by said first camera transporting mechanism;
a fifth step in which the image taken by said first camera is processed by said first recognition processing unit so as to acquire an actual position of said electronic component mounting position of the board; and
a sixth step in which while said mounting head transporting mechanism executes a positioning operation for positioning said mounting head to said electronic component mounting position based upon the actual position of said electronic component mounting position acquired by said first recognition processing unit, the electronic component held by said mounting head is mounted on said electronic component mounting position;
wherein while said electronic component held by the mounting head is mounted on said electronic component mounting position, said second camera is again transported over said electronic component supporting unit so as to take an image of an electronic component which is subsequently picked up by said mounting head.

2. The electronic component mounting method according to claim 1,
wherein said first camera takes an image of the electronic component mounting position of said board so as to acquire an image thereof in said fourth step, and said first recognition processing unit processes said image in order to acquire the actual position of said electronic component mounting position in said fifth step.

3. The electronic component mounting method according to claim 1,
wherein said first camera takes images of both said electronic component mounting position and adhesive agent coated at said electronic component mounting position so as to acquire images thereof in said fourth step, and
wherein said first recognition processing unit processes said acquired images in order to acquire the actual position of said electronic component mounting position and also to investigate a coating condition of adhesive agent coated at said electronic component mounting position in said fifth step.

4. The electronic component mounting method according to any one of claim 1 to claim 3,
wherein said electronic component mounting method is further comprised of:
a seventh step in which said first camera transporting mechanism transports said first camera over an electronic component mounting position of said board on which the electronic component has been mounted so as to take an image of said electronic component mounting position; and
an eight step in which the image taken in said seventh step is processed by said first recognition processing unit so as to investigate a mounting condition of said electronic component.

5. The electronic component mounting method according to claim 4,
wherein the subsequent fourth step is continuously carried out after said seventh step.

6. An electronic component mounting method executed by an electronic component mounting apparatus comprising: a mounting head for picking up an electronic component of an electronic component supplying unit to hold the picked electronic component, and for mounting said held electronic component on an electronic component mounting position of a board held by a board holding unit; a mounting head transporting mechanism for transporting said mounting head between said electronic component supplying unit and said board holding unit; a first camera for taking an image of the board held by said board holding unit; a first camera transporting mechanism for transporting said first camera over at least said board holding unit; a first recognition processing unit for processing an image taken by said first camera so as to acquire an actual position of said electronic component mounting position of the board held by said board holding unit; a second camera for taking an image of the electronic component of said electronic component supplying unit; a second camera transporting mechanism for transporting said second camera over at least said electronic component supplying unit; a second recognition processing unit for processing an image of said second camera so as to acquire a position of the electronic component of said electronic component supplying unit;

said electronic mounting method comprising:
a first step in which said second camera is transported to said electronic component supplying unit by said second camera transporting mechanism to take images of a plurality of electronic components, and thereafter said second camera is evacuated from an upper area of said plural electronic components by said second camera transporting mechanism;
a second step in which images taken by said second camera are processed by said second recognition processing unit so as to acquire positions of said plural electronic components;
a third step in which while said mounting head transporting mechanism executes a positioning operation for sequentially positioning said mounting head to said plural electronic components based upon the positions of the plural electronic components acquired by said second recognition processing unit, said plural electronic components are sequentially picked up by said mounting head;

a fourth step in which said first camera is transported by said first camera transporting mechanism over a board held by said board holding unit so as to take an image of said board by said first camera, and thereafter said first camera is evacuated from an upper area of said board by said first camera transporting mechanism;

a fifth step in which the image taken by said first camera is processed by said first recognition processing unit so as to acquire actual positions of said plural electronic component mounting positions of said board; and a sixth step in which while said mounting head transporting mechanism executes a positioning operation for sequentially positioning said mounting head to said plural electronic component mounting positions based upon the positions of said plural electronic component mounting positions acquired by said first recognition processing unit, the plural electronic components held by said mounting head are sequentially mounted on said plural electronic component mounting positions;

wherein while said electronic components held by the mounting head are sequentially mounted on said plural electronic component mounting positions, said second camera is again transported over said electronic component supporting unit so as to take images of a plurality of electronic components which are subsequently picked up by said mounting head.

7. The electronic component mounting method according to claim 6, wherein said first camera takes images of a plurality of electronic component mounting positions of said board so as to acquire images thereof in said fourth step, and wherein said first recognition processing unit processes said images in order to acquire the actual positions of said plural electronic component mounting positions in said fifth step.

8. The electronic component mounting method according to claim 6, wherein said first camera takes images of both said plural electronic component mounting positions and adhesive agent coated at said plural electronic component mounting positions so as to acquire images thereof in said fourth step, and wherein said first recognition processing unit processes said acquired images in order to acquire the actual positions of said plural electronic component mounting positions and also to investigate coating conditions of adhesive agent coated at said plural electronic component mounting positions in said fifth step.

9. The electronic component mounting method according to any one of claim 6 to claim 8, wherein said electronic component mounting method further comprises:

a seventh step in which said first camera transporting mechanism transports said first camera over a plurality of electronic component mounting positions of said board on which the electronic components have been mounted so as to take images of said plural electronic component mounting positions; and an eighth step in which the images taken in said seventh step are processed by said first recognition processing unit so as to investigate mounting conditions of said plural electronic components.

10. The electronic component mounting method according to claim 9, wherein the subsequent fourth step is continuously carried out after said seventh step.

\* \* \* \* \*